United States Patent [19]

Faludy

[11] Patent Number: 5,433,259

[45] Date of Patent: Jul. 18, 1995

[54] RETRACTABLE AWNING WITH INTEGRATED SOLAR CELLS

[75] Inventor: Thomas G. Faludy, Westminster, Colo.

[73] Assignee: Carefree/Scott Fetzer Company, Broomfield, Colo.

[21] Appl. No.: 155,740

[22] Filed: Nov. 22, 1993

[51] Int. Cl.⁶ .................................. E04F 10/06
[52] U.S. Cl. ...................... 160/67; 160/127; 136/245; 136/291
[58] Field of Search ........... 160/67, 66, 22, 127; 135/89; 136/245, 291

[56] References Cited

U.S. PATENT DOCUMENTS

| | | | |
|---|---|---|---|
| 4,634,172 | 1/1987 | Duda | 160/66 X |
| 4,636,579 | 1/1987 | Hanak et al. | 136/291 X |
| 4,807,686 | 2/1989 | Schnebly et al. | 160/84.1 E X |
| 4,909,296 | 3/1990 | Sellke et al. | |
| 4,924,895 | 5/1990 | Bailie | 160/67 X |
| 4,941,524 | 7/1990 | Greer | 160/67 |
| 5,029,428 | 7/1991 | Hiraki | 160/166.1 R X |
| 5,040,585 | 8/1991 | Hiraki | 160/166.1 R X |
| 5,258,076 | 11/1993 | Wecker | 136/245 |

OTHER PUBLICATIONS

Solar Cell brochure, Iowa Thin Film Technologies.

*Primary Examiner*—David M. Purol
*Attorney, Agent, or Firm*—Gary M. Polumbus; Holland & Hart

[57] ABSTRACT

A retractable awning includes a weather protective articulated slat system for protecting the awning when in a retracted position with a solar cell panel incorporated into an articulated slat and connected to a battery for charging the battery.

4 Claims, 3 Drawing Sheets

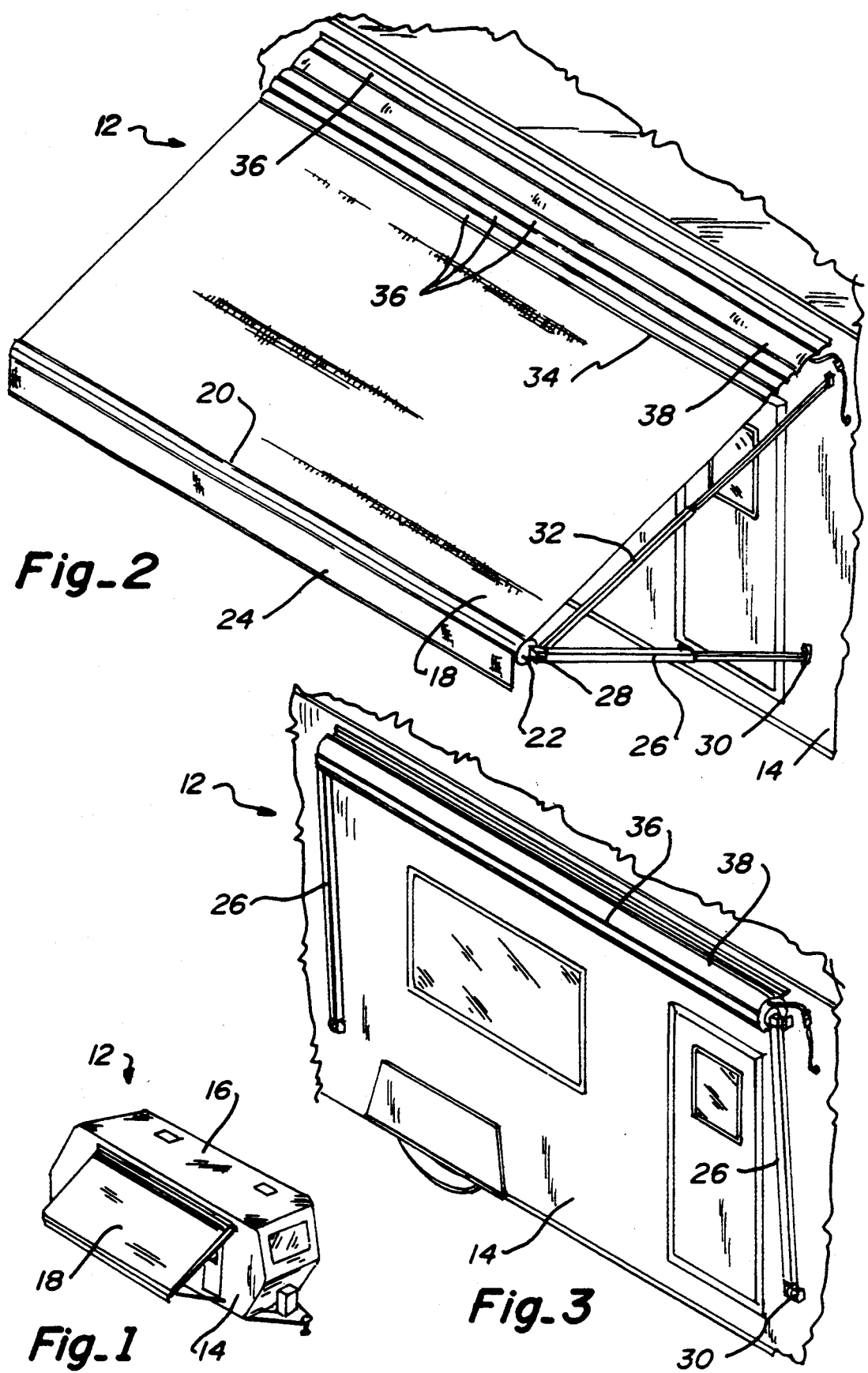

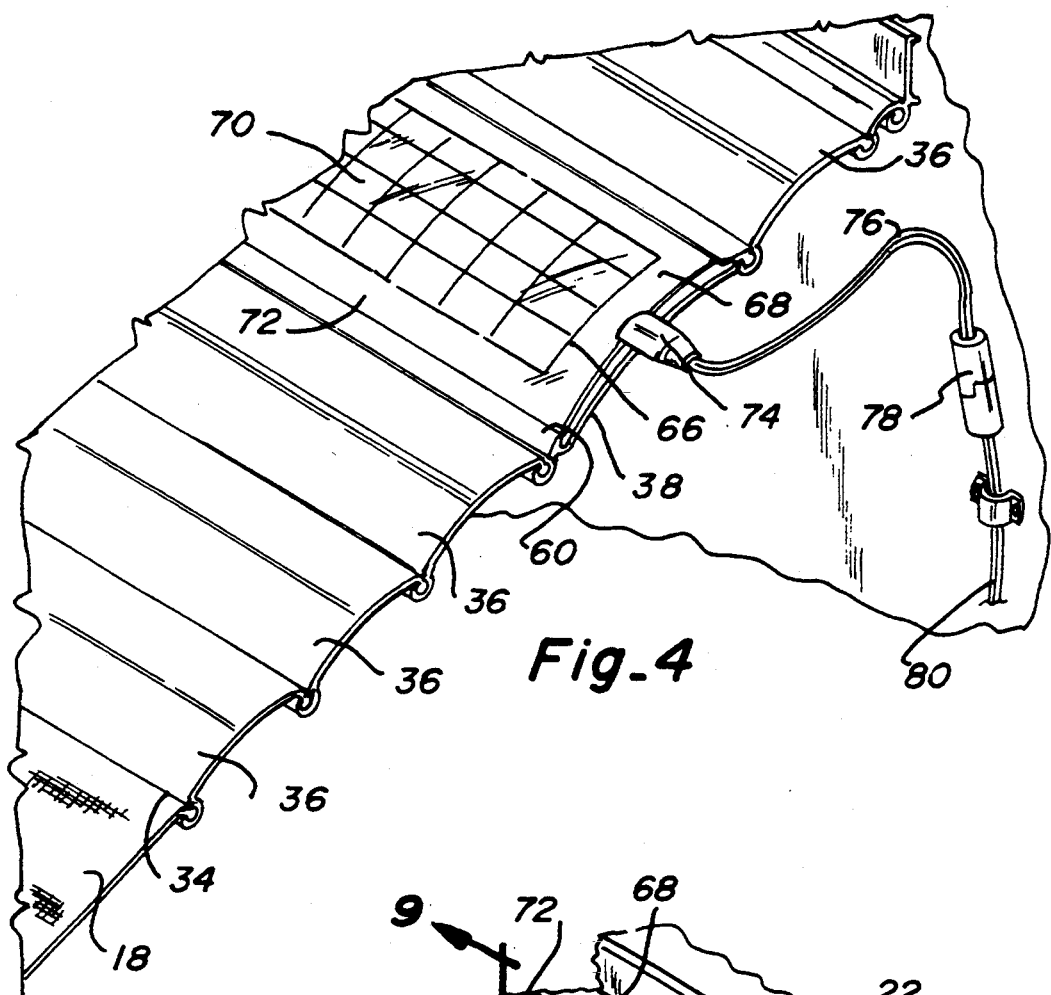
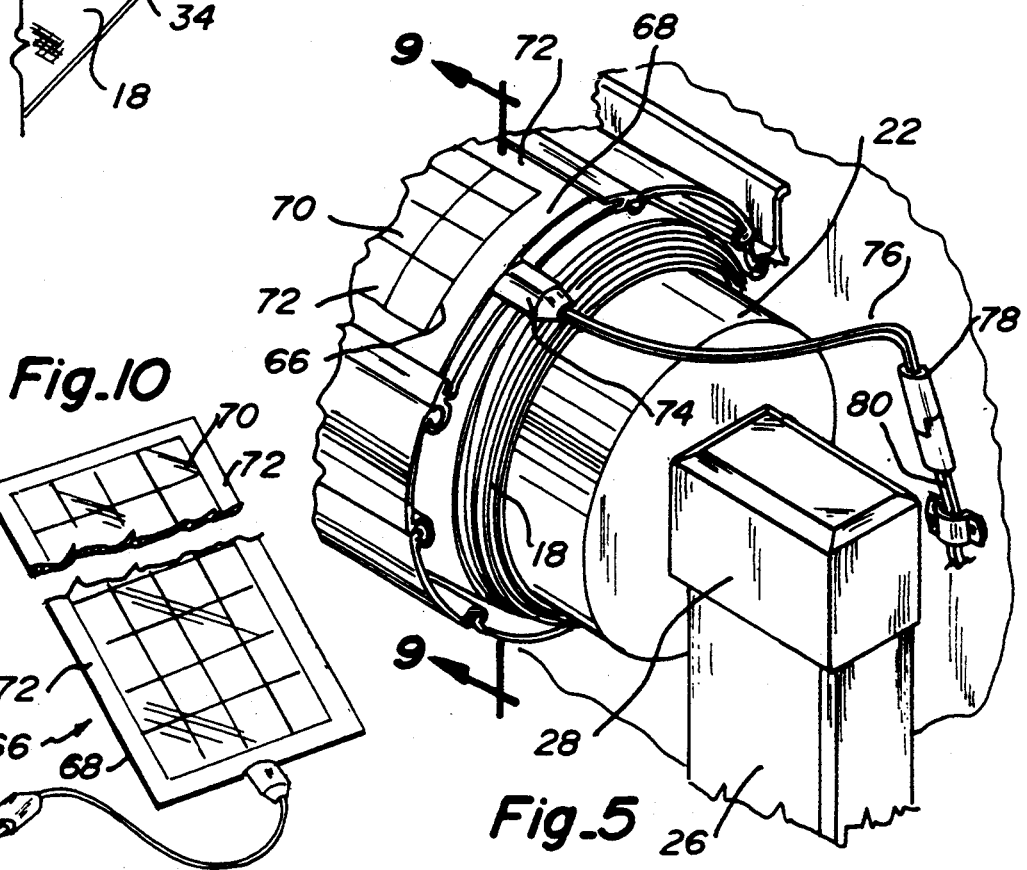

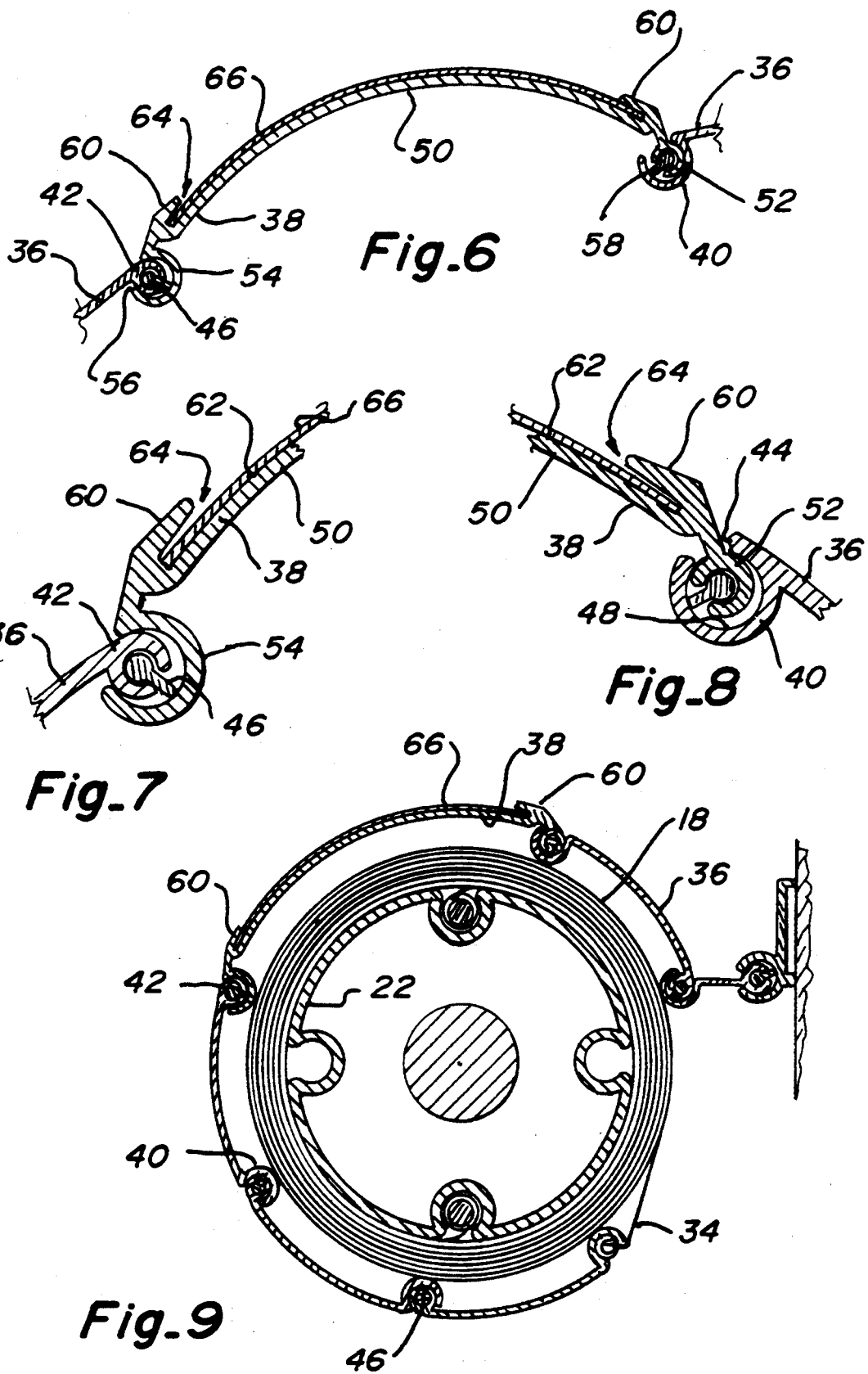

RETRACTABLE AWNING WITH INTEGRATED SOLAR CELLS

BACKGROUND OF THE INVENTION

1. Field of the Invention

The present invention relates generally to retractable awnings and more particularly to a retractable awning that incorporates solar cells for generating electricity from solar radiation.

2. Description of the Prior Art

Retractable awnings have been utilized for many years, particularly as awnings for windows or entry doors of building structures. The awnings are typically rolled out during daylight hours to block undesired sun rays and rolled in at night when the sun has gone down. Such awnings normally include a roll bar which is mounted in a moveable manner along an outer edge of the awning sheet so as to roll away from and back to the building as the awning is extended and retracted, respectively.

More recently, retractable awnings have also been mounted on the sides of mobile homes, recreational vehicles, travel trailers or the like. These newer versions of the retractable awning normally include support posts for supporting the outer edge of the awning sheet either by forming a brace from a side wall of the vehicle or by forming a ground support.

A concern with all retractable awnings relates to deterioration of the awning such as is caused by adverse weather elements or prolonged exposure to the sun. Accordingly, it is not uncommon to provide a strip of weather retardant fabric or rubberized material adjacent the inner edge of the awning sheet so that when the awning sheet is completely rolled into its retracted position, the weather retardant material will surround the remaining portion of the awning sheet thereby protecting the awning sheet from adverse environmental elements and ultraviolet radiation from the sun. Some retractable awnings for recreational vehicles and the like have even been mounted in metallic boxes so that the box can be closed to protect the awning when it is retracted.

A more recent development adapted to protect an awning from environmental elements when the awning is not in use consists of a plurality of elongated slats, usually of aluminum, which are pivotally connected along their length in an articulated manner so as to envelop or encapsulate the awning when it is rolled into its retracted position. The articulated slats are used in lieu of weather retardant fabric materials. One problem with the articulated slats, however, is that the joints between adjacent slats typically are not watertight. Accordingly, rain, water and the like can seep between adjacent slats and leak underneath the awning in an undesired manner.

Systems have been designed to prevent leakage between the slats so that the slat system for protecting the awning sheet is becoming more popular. An example of a system for sealing the joints between adjacent articulated slats is disclosed in U.S. Pat. No. 4,909,296, entitled "Water-Tight Sealing System for Articulated Slats" which is commonly owned with the present application.

Since most recreational vehicles, travel trailers or the like are frequently in remote locations where they cannot be directly connected to a source of electric power, and since there are numerous needs for electricity on such vehicles, it has been commonplace to provide gasoline powered generators for such vehicles. The use of such generators, however, is not totally desirable in that they are noisy and thus disrupting in serene environments where such vehicles are many times taken. If the electrically driven accessory items on the vehicle are powered by battery and are used very extensively, they will run down the battery and accordingly there has been a need for alternative sources of electrical power for such vehicles.

With the recent developments in solar collectors, solar cells and the like, it is known to mount such a collector or cell on the top of a recreational vehicle, travel trailer or the like so that electrical energy can be gathered and stored in a battery any time the sun is shining, but the solar collectors and cells take up valuable space on the top of the vehicle where many times air conditioning units, storage space and the like is provided.

It is against this background that the retractable awning of the present invention has been developed.

SUMMARY OF THE INVENTION

The retractable awning of the present invention is of the type disclosed in detail in the aforenoted U.S. Pat. No. 4,909,296 for Water-Tight Sealing System For Articulated Slats which patent is hereby incorporated by reference. The awning includes a flexible fabric awning sheet which is retractably supported adjacent a support surface by a roll bar secured to a distal or outer edge of the awning sheet, a pair of support arms and rafter arms operably connected to the roll bar and mounted on the support surface, the support and rafter arms being moveable to selectively extend or retract the awning sheet.

A plurality of articulated somewhat rigid slats are secured to a proximal or inner edge of the awning sheet and interconnect the awning sheet with the support surface when the awning is moved into its retracted position so that the awning sheet is wrapped around the roll bar and positioned adjacent to the support surface, the articulated slats form a generally cylindrical protective cover around the awning sheet.

A uniquely designed articulated slat has a panel of solar cell material connected to an external surface thereof so that the solar cell panel is exposed to the ambient environment and solar radiation regardless of whether or not the awning is in the retracted or extended position.

Other aspects, features and details of the present invention can be more completely understood by reference to the following detailed description of a preferred embodiment, taken in conjunction with the drawings, and from the appended claims.

BRIEF DESCRIPTION OF THE DRAWING

FIG. 1 is an isometric view of a travel trailer having the retractable awning of the present invention mounted thereon.

FIG. 2 is a fragmentary isometric view of the retractable awning of the present invention mounted on the sidewall of the travel trailer shown in FIG. I with the awning in an extended position.

FIG. 3 is a fragmentary isometric view similar to FIG. 2 with the awning in a retracted position.

FIG. 4 is an enlarged fragmentary isometric view of a portion of the retractable awning that includes the solar cell material with the awning in an extended position.

FIG. 5 is a fragmentary isometric view similar to FIG. 4 with the awning in a retracted position.

FIG. 6 is an enlarged fragmentary section taken along line 6—6 of FIG. 4.

FIG. 7 is an enlarged fragmentary section showing one side edge of an articulated slat having the solar cell material of the present invention incorporated therein.

FIG. 8 is an enlarged fragmentary section similar to FIG. 7 showing the opposite edge of the articulated slat in which the solar cell material is incorporated.

FIG. 9 is an fragmentary section taken along line 9—9 of FIG. 5.

FIG. 10 is a fragmentary isometric view of a flexible solar cell material incorporated into the awning of the present invention.

DESCRIPTION OF THE PREFERRED EMBODIMENT

Referring initially to FIGS. 1-3, the retractable awning 12 of the present invention can be seen mounted on a vertical side wall 14 of a travel trailer 16. The awning includes a flexible fabric awning sheet 18 having its outermost or distal edge 20 attached to a roll bar 22 in a conventional manner. The roll bar further supports an elongated valance 24 for decorative purposes. A pair of support arms 26 rotatably support the roll bar at their distal ends 28 and are releasably secured to the side wall of the travel trailer at their proximal ends 30. A pair of rafter arms 32 cooperating with the support arms 26 extend from an elevated location on the side wall 14 of the travel trailer and are slidable along the length of an associated support arm as the awning is moved between the extended and retracted positions of FIGS. 2 and 3 respectively. An awning having the aforenoted component parts is described in more detail in U.S. Pat. No. 4,759,396, entitled "Lock Mechanism for Roll Bar on Retractable Awning" which is of common ownership with the present application and is hereby incorporated by reference.

The innermost or proximal edge 34 of the awning sheet 18 is interconnected with the side wall of the travel trailer through a plurality of relatively rigid elongated slats 36 and 38 extending transversely of the awning and in parallel relationship with the side wall 14 of the travel trailer. The awning sheet in combination with the slats define an awning canopy. There are a plurality of the articulated slats so that when the awning is moved into its retracted position of FIG. 3, the slats form a cylindrical encompassing shell around the awning sheet to protect the sheet from environmental elements.

With the exception of one of the slats designated 38, the slats 36 are all identical and are pivotally interconnected in a manner described in more detail in the aforenoted U.S. Pat. No. 4,909,296. It will be appreciated by reference to FIGS. 4-9, that each articulated slat 36 is of arcuate transverse cross-section so as to be convex outwardly and having one longitudinal edge in the form of a female connection element 40 and the opposite longitudinal edge in the form of a male connection element 42. Both the male and female connection elements are of generally C-shaped cross-sectional configuration. The male element 42 is slightly smaller than the female element 40 in cross-section so that adjacent articulated slats can be interconnected by sliding a male element longitudinally into a female element thereby establishing a pivotal or articulated interconnection between adjacent slats. The female element has a longitudinal slot 44 through which the adjacent slat protrudes. The male element has a larger diameter than the width of the slot 44 so that the male element is pivotally confined within the female element.

In order to prevent leakage between adjacent interconnected slats 36, a rubber wiper 46 is positioned within the male element 42 and protrudes out of the male element so as to engage an internal surface 48 of the female element. The wiper 46 thereby prevents water leakage through the joint between adjacent slats in a manner described in more detail in the aforenoted U.S. Pat. No. 4,909,296.

The aforenoted one articulated slat 38 is different from the other slats 36 in that it is preferably slightly wider but it also is pivotally connected along opposite longitudinal edges to adjacent slats. The slat 38 has an arcuate outwardly convex main body portion 50 with an elongated male connection element 52 along one longitudinal edge and an elongated female connection element 54 along the opposite longitudinal edge. As with the other slats, the male and female connection elements are generally C-shaped in transverse cross-section with the male element being smaller than and pivotally received within the female element. The male connection element protrudes out of a slot 56 defined in the female element. A rubber wiper blade 58 is also positioned within the male connection element to establish a water-tight connection of that edge of the slat 38 with the adjacent slat 36. Along opposite longitudinal edges of the slat, an elongated flange 60 is provided which extends the full length of the slat in spaced parallel relationship with the outer surface of the main body portion of the slat. Each of the flanges 60 thereby defines an elongated recess 64 also extending the full length of the slat adjacent to the outer surface.

A flexible solar cell panel 66 of rectangular configuration and seen best in FIGS. 4-10 is mounted on the slat 38 so as to overly the outwardly convex main body portion 50 of the slat. The solar panel has a thin flexible plastic substrate 68 and a central portion 70 of electrically interconnected solar cells so that a narrow peripheral margin area 72 of substrate only is defined. The peripheral margin area 72 along opposite longitudinal sides of the solar cell panel is captured in the elongated recesses 64 on the slat 38 and the substrate material is rigid enough to prevent it from being inadvertently removed from the elongated recesses. The substrate is flexible enough, however, to conform with the curved configuration of the slat. The solar cell panel 66 may be of the type manufactured by Iowa Thin Film Technologies of Ames, Iowa and marketed under the product designation "Flexible Solar Cells." The solar cell panel is designed to attract and absorb solar radiation and convert the radiation into electricity. One end of the solar cell panel has an electrical connector 74 (FIG. 5) in which positive and negative terminals of the panel are connected to a flexible electrical conduit 76 which in turn is releasably connected to a separate electrical connector 78 and an electrical line 80 passing along the side wall 14 of the travel trailer to a storage battery (not shown) on the trailer. The solar cell panel is capable of trickle charging the battery so that electrical energy is more dependably available from the battery thereby providing longer drawdown periods.

Typically, the solar cell panel 66 is frictionally received within the elongated recesses 64 of the slat 38 so that the material can be longitudinally slid into the recesses until desirably positioned on the slat but will not readily shift from that position. If necessary, however, a rivet (not shown) can be passed through the flanges 60 and the margin area 72 of the solar panel to positively hold the panel in place.

As will be appreciated by reference to FIGS. 4, 5 and 9, with the slat 38 containing the solar cell panel 66 being positioned fairly close to the support surface or side wall of the travel trailer, the solar cell panel will always be disposed at a desirable angle for collecting solar energy regardless of whether or not the awning is in the extended or retracted position.

By incorporating the solar panel into the retractable awning in the aforenoted manner, electric batteries can be continuously charged in sunlight conditions without occupying valuable space on a vehicle which could be used for other purposes. Further, the flexible nature of the solar cell panel allows it to conform to the arcuate configuration of the slat 38 on which it is mounted thereby providing an attractive aesthetic addition to the weather retardant materials traditionally used to protect an awning sheet from environmental elements.

Although the present invention has been described with a certain degree of particularity, it is understood that the present disclosure has been made by way of example, and changes in detail or structure may be made without departing from the spirit of the invention, as defined in the appended claims.

I claim:

1. A retractable awning for mounting on a support surface and movable between an extended and retracted position comprising in combination:
   an awning canopy having an outer edge and an inner edge, said inner edge being operably connected to said support surface,
   a roll bar connected to said outer edge so that the awning canopy can be wrapped around the roll bar when the awning is retracted,
   a supporting framework for selectively retaining the awning in a retracted or extended position, and
   a panel having solar cells operably connected to said awning canopy for collecting solar radiation and converting the radiation to a usable energy form; said awning canopy including an awning sheet having said inner edge operably connected to said support surface by a plurality of articulated slats adapted to surround the awning sheet and the roll bar when the awning is retracted, and wherein said panel is operably affixed to one of said slats, said slats also comprising a part of said canopy.

2. The retractable awning of claim 1 wherein said solar cells convert solar radiation to electricity and wherein said panel further includes electrical wiring for transferring the electricity to a storage medium.

3. A retractable awning for mounting on a support surface and movable between an extended and retracted position comprising in combination:
   an awning sheet having an outer edge and an inner edge, said inner edge being operably connected to said support surface by a plurality of articulated slats adapted to surround the awning sheet and the roll bar when the awning is retracted, one of said slats having an outer surface and opposed longitudinally extending recesses along said outer surface,
   a roll bar connected to said outer edge so that the awning sheet can be wrapped around the roll bar when the awning sheet is retracted,
   a supporting framework for selectively retaining the awning in a retracted or extended position, and
   a panel having solar cells operably connected to said awning sheet for collecting solar radiation and converting the radiation to a usable energy form, said panel being received and retained in said recesses so as to overlie said outer surface.

4. The retractable awning of claim 3 wherein said panel is flexible and said one of said slats is arcuate in transverse cross-section.

* * * * *